United States Patent [19]
Holte

[11] Patent Number: 4,782,116
[45] Date of Patent: Nov. 1, 1988

[54] HOMOGENEOUS THERMOSET TERPOLYMERS

[75] Inventor: Mark D. Holte, La Crosse, Wis.

[73] Assignee: Allied-Signal Inc., Morris Township, Morris County, N.J.

[21] Appl. No.: 69,783

[22] Filed: Jul. 6, 1987

Related U.S. Application Data

[63] Continuation-in-part of Ser. No. 887,398, Jul. 21, 1986, abandoned.

[51] Int. Cl.$^4$ .................. C08F 8/00; C08F 283/10; C08L 61/04; C08G 65/08
[52] U.S. Cl. ..................... 525/109; 525/113; 525/114; 525/115; 525/122; 525/529; 525/534; 528/104; 528/96; 528/99
[58] Field of Search ............... 525/529, 534, 109, 113, 525/114, 115, 122; 528/104, 96, 99

[56] References Cited
U.S. PATENT DOCUMENTS

| | | | |
|---|---|---|---|
| 4,142,034 | 2/1979 | Schroll | 528/99 |
| 4,544,704 | 10/1985 | Hefner, Jr. | 525/529 |
| 4,546,131 | 10/1985 | Hefner, Jr. | 528/96 |
| 4,555,553 | 11/1985 | Hefner, Jr. | 528/96 |
| 4,558,115 | 12/1985 | Hefner, Jr. | 528/92 |
| 4,661,553 | 4/1987 | Hefner, Jr. | 528/99 |
| 4,665,154 | 5/1987 | Varnell et al. | 528/172 |

*Primary Examiner*—Harold D. Anderson
*Assistant Examiner*—Dennis R. Daley
*Attorney, Agent, or Firm*—Jay P. Friedenson; Harold N. Wells

[57] ABSTRACT

Homogeneous thermoset terpolymers which may be used in the preparation of laminates for circuitry boards will comprise a diepoxide of a polyether of a polyphenol, a dicyanate ester of a polyether of a polyphenol and an alkenyl aryl compound. The polymers are prepared by admixing a solution of the diepoxide of a polyether of a polyphenol and an alkenyl aryl compound with a second solution of the dicyanate ester of a polyether of a polyphenol and the alkenyl aryl compound at elevated temperatures. The resulting terpolymer will possess desirable characteristics such as high glass transition temperature and low dielectric constant.

36 Claims, No Drawings

HOMOGENEOUS THERMOSET TERPOLYMERS

CROSS-REFERENCE TO RELATED APPLICATIONS

This application is a Continuation-in-part of prior copending application Ser. No. 887,398 filed July 21, 1986, now abandoned.

BACKGROUND OF THE INVENTION

With the advent of sophisticated equipment in the electrical and electronic fields, it has become necessary that the components of the various pieces of equipment conform to high standards which are set forth in the specifications for these components. For example, circuit boards which are used in relatively complicated pieces of equipment such as main frame computers, must be of a relatively high standard of quality in order to function in an efficient manner for a long period of time without deteriorating or breaking down, and thus causing an interruption in the function of the machine. This high quality of material is opposed to pieces of equipment requiring a lower standard of quality such as those used in personal computers, high quality television equipment, radios, etc.

Circuit boards upon which a circuit is etched or implanted usually comprise a laminate which is composed of a synthetic polymeric substance which possesses desirable characteristics such as thermal stability, low coefficient of thermal expansion, dimensional stability, low dielectric constant, solvent resistance, low moisture absorption, etc. and a suitable reinforcement matrix, such as glass, quartz, graphite, Kevlar, etc.

As will hereinafter be shown, it has now been discovered that a homogeneous thermoset terpolymer of a diepoxide of a polyether of a polyphenol, a cyanate ester of a polyether of a polyphenol, and an alkenyl aryl compound may be used in the preparation of laminates which themselves will form a component of a circuit board and will possess the desirable characteristics hereinbefore set forth.

BRIEF SUMMARY OF THE INVENTION

This invention relates to homogeneous thermoset terpolymers. More specifically, the invention is concerned with novel high temperature homogeneous thermoset terpolymers and to a method for the preparation thereof. As was previously mentioned, the homogeneous thermoset terpolymers of the present invention, which constitute novel compositions of matter, may be used to coat and/or impregnate a substrate which is thereafter cured and utilized in circuit board laminates and dielectric coatings, the use thereof being attributable to the desirable characteristics which are possessed by these polymeric compositions of matter. The particular characteristics of the polymer dielectric and reinforcing components which go to make up the circuit boards contribute to the efficiency and stability of the final electronic equipment in which the circuit boards are used. For example, a lowering of the dielectric constant in the polymer matrix reduces the signal delay time or "cross-talk" and line capacitance. This results in faster PWB circuitry and, in addition, provides the potential to increase the number of functions per board. The polymeric matrix of the present invention possesses a lower dielectric constant than that which is possessed by thermosetting polyimide or epoxy matrices which are used as the standards by the industry for electrical laminates.

Another desirable characteristic of a polymer matrix for use in circuit boards is that the coefficient of thermal expansion should be relatively low in order to avoid a mismatch of thermal expansions with the electronic components and the fiberglass reinforcement with which the polymeric matrix is composited. The coefficient of expansion of the novel homogeneous thermoset terpolymers of the present invention may be comparable to a polyimide matrix. Furthermore, the thermal stability of the polymer matrix must be relatively high in nature inasmuch as the matrix must possess the ability to withstand soldering temperatures without melting or degrading. A desirable characteristic of the homogeneous thermoset terpolymer of the present invention is that the thermal stability of the polymer is comparable to a polyimide matrix.

In addition, by varying the ratio of the three components of the terpolymer, it is possible to provide a wide range of properties which will meet various and specific circuit board requirements. Furthermore, it is also possible by preparing the terpolymers in a manner hereinafter set forth in greater detail, to provide a terpolymer which will meet the requirement for chip encapsulation, potting materials and metal foil coatings.

It is therefore an object of this invention to provide novel homogeneous thermoset terpolymers.

Another object of this invention is to provide a method for preparing the aforesaid homogeneous thermoset terpolymers which are useful as a component in the formulation of circuit board laminates.

In one aspect, an embodiment of this invention resides in homogeneous thermoset terpolymers consisting essentially of:

(1) from about 30% to about 50% by weight of said terpolymer of a diepoxide of a polyether of a polyphenol having the structure:

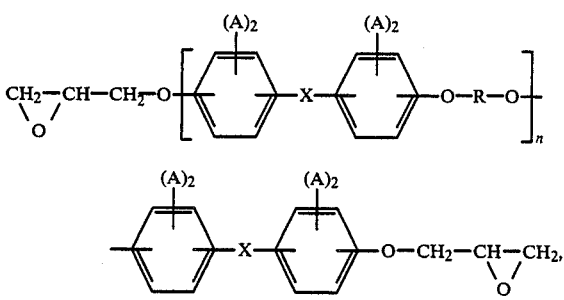

in which X is selected from the group consisting of

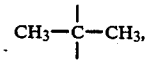

$SO_2$, O, and $CH_2$ radicals, R is selected from the group consisting of $-CH_2-C_6H_4-CH_2-$, $(CH_2)_b$ in which b ranges from 1 to about 6, $-CH_2-CH=CH-CH_2-$, $-CH_2-C\equiv C-CH_2-$, $-CH_2-C_6H_2A_2-CH(OY)-CH_2-CH(CH_2OY)-C_6H_2A_2-CH_2-$, $-N=CH-O-C_6H_4-C(CH_3)_2-C_6H_4-O-CH=N-$, $-CH(NH)-O-C_6H_4-C(CH_3)_2-C_6H_4-O-CH(NH)-$, $-C_6H_4-CH(OY)-CH_2-CH(M)-CH_2-CH(CH_2OY)-C_6H_4-$, $-CH_2-CH(OH)-CH-$ 2—O—$C_6H_4$—C($CH_3$)$_2$—$C_6H_4$—O—$CH_2$—CH(OH)—$CH_2$—, and —$C_2$—CH(OH)—$CH_2$—O—$C_6H_2Br_2$—C($CH_3$)$_2$—$C_6H_2Br_2$—O—$CH_2$—CH(OH)—$CH_2$—radicals, where M is —$C_6H_5$, —$C_6H_4(CH_3)$, or —$C_6H_4(CH=CH_2)$ and Y is a free radical such as hydroquinone, A is independently selected from the group consisting of hydrogen, chlorine, bromine, fluorine, alkyl, alkoxy and phenyl radicals and n has an average value in the range of from about 0 to about 20;

(2) from about 15% to about 20% by weight of said terpolymer of a dicyanate ester of a polyether of a polyphenol having the structure:

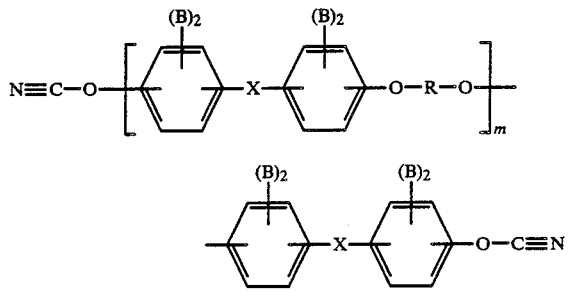

in which X is selected from the group consisting of

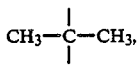

$SO_2$, O, S, and $CH_2$ radicals, R is selected from the group consisting of —$CH_2$—$C_6H_4$—$CH_2$—, $(CH_2)_b$ in which b ranges from 1 to about 6, —$CH_2$—CH=CH—$CH_2$—, —$CH_2$—C≡C—$CH_2$,

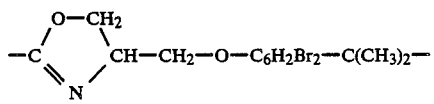

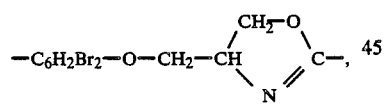

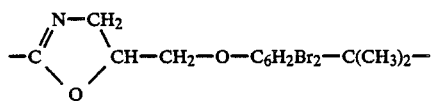

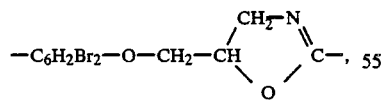

and;

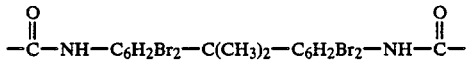

radicals, B is independently selected from the group consisting of hydrogen, chlorine, bromine, fluorine, alkyl, alkoxy and phenyl radicals and m has an average value in the range of from about 0 to about 20; and (3) from about 30% to about 50% by weight of said terpolymer of an alkenyl aryl compound.

Another embodiment of this invention resides in a process for the production of a homogeneous thermoset terpolymer which consists in reacting a blend consisting of:

(1) a diepoxide of a polyether of a polyphenol having the structure:

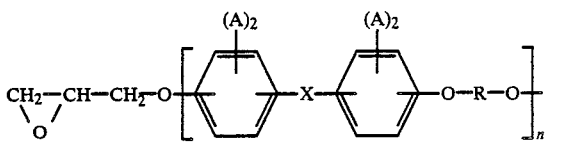

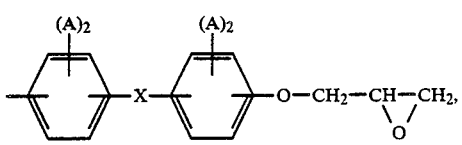

in which X is selected from the group consisting

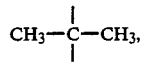

of $SO_2$, O, and $CH_2$ radicals, R is selected from the group consisting of —$CH_2$—$C_6H_4$—$CH_2$—, $(CH_2)_b$ in which b ranges from 1 to about 6, —$CH_2$—CH=CH—$CH_2$—, —$CH_2$—C≡C—$CH_2$—, —$CH_2$—$C_6H_2A_2$—CH(OY)—$CH_2$—CH($CH_2$OY)—$C_6H_2A_2$—$CH_2$—, —N=CH—O—$C_6H_4$—C($CH_3$)$_2$—$C_6H_4$—O—CH=N—, —CH(NH)—O—$C_6H_4$—C($CH_3$)$_2$—$C_6H_4$—O—CH(NH)—, —$C_6H_4$—CH(OY)—$CH_2$—CH(M)—$CH_2$—CH($CH_2$OY)—$C_6H_4$—, —$CH_2$—CH(OH)—$CH_2$—O—$C_6H_4$—C($CH_3$)$_2$—$C_6H_4$—O—$CH_2$—CH(OH)—$CH_2$—, and —$CH_2$—CH(OH)—$CH_2$—O—$C_6H_2Br_2$—C($CH_3$)$_2$—$C_6H_2Br_2$—O—$CH_2$—CH(OH)—$CH_2$—, radicals, where M is —$C_6H_5$, —$C_6H_4(CH_3)$ or —$C_6H_4(CH=CH_2)$ and Y is a free radical such as hydroquinone, A is independently selected from the group consisting of hydrogen, chlorine, bromine, fluorine, alkyl, alkoxy and phenyl radicals and n has an average value in the range of from about 0 to about 20, and an alkenyl aryl compound with a blend consisting of:

(2) a dicyanate ester of a polyether of a polyphenol having the structure:

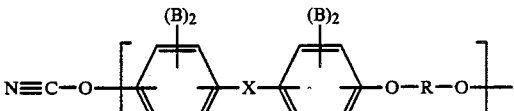

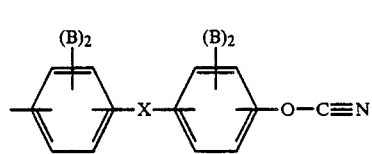

in which X is selected from the group consisting of

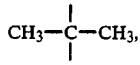

SO$_2$, O, S, and CH$_2$ radicals, R is selected from the group consisting of —CH$_2$—C$_6$H$_4$—CH$_2$—, (CH$_2$)$_b$ in which b ranges from 1 to about 6, —CH$_2$—CH=CH—CH$_2$—, —CH$_2$—C≡C—CH$_2$—,

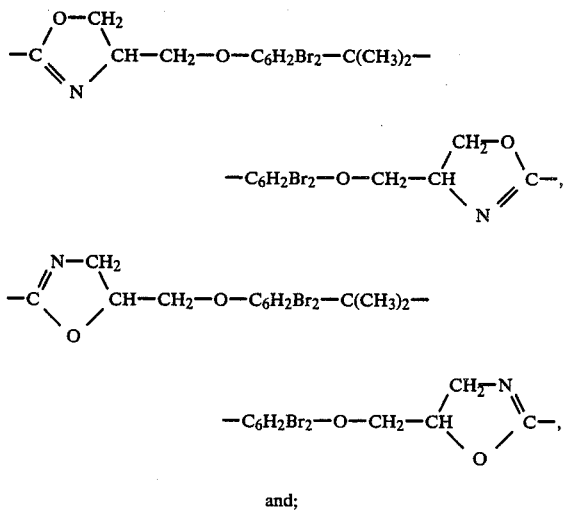

and;

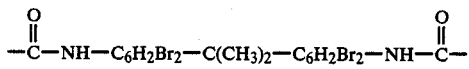

radicals, B is independently selected from the group consisting of hydrogen, chlorine, bromine, fluorine, alkyl, alkoxy and phenyl radicals and m has an average value in the range of from about 0 to about 20 and an alkenyl aryl compound at reaction conditions, and recovering the resultant homogeneous thermoset terpolymer.

A specific embodiment of this invention resides in a homogeneous thermoset terpolymer comprising diepoxide substituted p,p'-isopropylidenediphenol, the dicyanate ester of p,p'-isopropylidenediphenol and divinylbenzene.

Other objects and embodiments will be found in the following further detailed description of the invention.

DETAILED DESCRIPTION OF THE INVENTION

As hereinbefore set forth, the present invention is concerned with novel homogeneous thermoset terpolymers and to a method for the preparation of these terpolymers. The homogeneous thermoset terpolymers will comprise a mixture of a poly(vinyl benzyl ether) of a polyphenol, a cyanate ester of a polyether of a polyphenol, and an alkenyl aryl compound. The polymerization of these compounds will result in a terpolymer which, because of its particular structure, will be useful in electronic circuitry, inasmuch as the terpolymer will possess relatively low dielectric constants and high glass transition temperatures. In addition to these desirable characteristics, the terpolymer will also possess a low viscosity and will be 100% solids, that is, at least 99.5% of the components may react to form a cured resin matrix. These resins or varnishes which have 100% solids, or less than 0.5% non-reacting components, are excellent candidates for continuous lamination or reinforced reaction in injection molding, composite reaction injection molding or resin transfer molding applications. By possessing the 100% solids property, the polymeric composite can be processed in various ways in contrast to previous solvent-based polymers which do not possess 100% solids and therefore cannot be processed in many applications.

The diepoxide of a polyether of a polyphenol which forms one component of the terpolymer of the present invention will possess the generic structure:

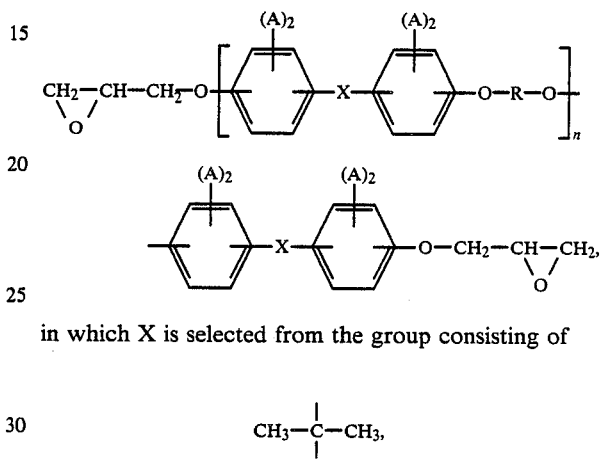

in which X is selected from the group consisting of $$CH_3-\underset{|}{\overset{|}{C}}-CH_3,$$

SO$_2$, O, and CH$_2$ radicals, R is selected from the group consisting of —CH$_2$—C$_6$H$_4$—CH$_2$—, (CH$_2$)$_b$ in which b ranges from 1 to about 6, —CH$_2$—CH=CH—CH$_2$—, —CH$_2$C≡C—CH$_2$, —CH$_2$—C$_6$H$_2$A$_2$—CH(OY)—CH$_2$—CH(CH$_2$OY)—C$_6$H$_2$A$_2$—CH$_2$—, —N=CH—O—C$_6$H$_4$—C(CH$_3$)$_2$—C$_6$H$_4$—O—CH=N—, —CH(NH)—O—C$_6$H$_4$—C(CH$_3$)$_2$—C$_6$H$_4$—O—CH(NH)—, —C$_6$H$_4$—CH(OY)—CH$_2$—CH(M)—CH$_2$—CH(CH$_2$OY)—C$_6$H$_4$—, —CH$_2$—CH(OH)—CH$_2$—O—C(CH$_3$)$_2$—C$_6$H$_4$—O—CH$_2$—CH(OH)—CH$_2$—, and —CH$_2$—CH(OH)—CH$_2$—O—C$_6$H$_2$Br$_2$—C(CH$_3$)$_2$—C$_6$H$_2$Br$_2$—O—CH$_2$—CH(OH)—CH$_2$— radicals, where M is —C$_6$H$_5$, —C$_6$H$_4$(CH$_3$) or —C$_6$H$_4$(CH=CH$_2$) and Y is a free radical such as hydroquinone, A is independently selected from the group consisting of hydrogen, chlorine, bromine, fluorine, alkyl, alkoxy and phenyl radicals and n has an average value in the range of from about 0 to about 20.

The second component of the terpolymer of the present invention will comprise a dicyanate ester of a polyether of a polyphenol which possesses the generic structure:

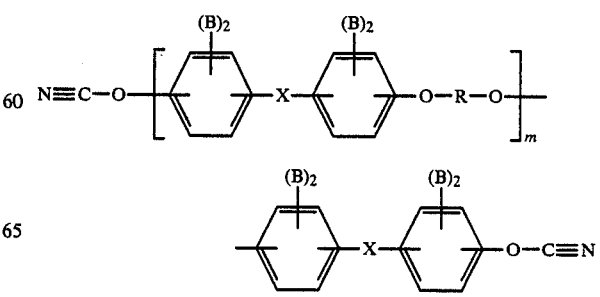

in which X is selected from the group consisting of

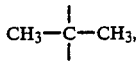

$SO_2$, O, S, and $CH_2$ radicals, R is selected from the group consisting of $-CH_2-C_6H_4-CH_2-$, $(CH_2)_b$ in which b ranges from 1 to about 6, $-CH_2-CH=CH-CH_2-$, $-CH_2-C\equiv C-CH_2-$,

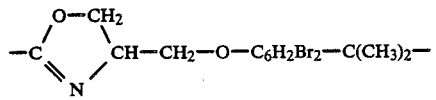

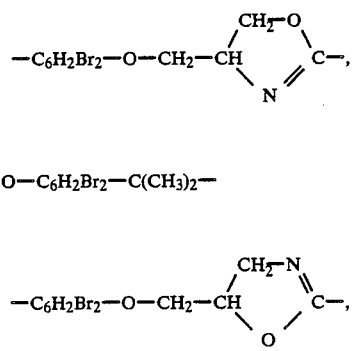

and;

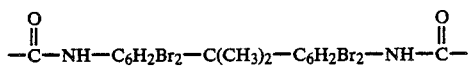

radicals, B is independently selected from the group consisting of hydrogen, chlorine, bromine, fluorine, alkyl, alkoxy and phenyl radicals and m has an average value in the range of from about 0 to about 20.

The third component of the terpolymer of the present invention will comprise an alkenyl aryl compound. The term "alkenyl aryl compound" as used in the present specification and appended claims will refer to aromatic hydrocarbons containing at least one unsaturated or alkenyl substituent on the ring. These alkenyl aryl compounds will possess generic formula:

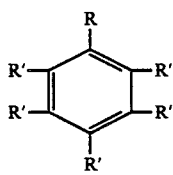

in which R is an alkenyl radical selected from the group consisting of vinyl, allyl and methylallyl radicals and R' is independently selected from the group consisting of hydrogen, fluorine, chlorine, bromine, methyl, chloromethyl, bromomethyl, alkenyl, t-butyl, $(CH_2)_nCH_3$ in which n is an integer from 1 to 10 and phenyl radicals. Some specific examples of these alkenyl aryl compounds which may be used in the present invention will include styrene, allylbenzene, methallylbenzene, o-divinylbenzene, m-divinylbenzene, p-divinylbenzene, o-diallylbenzene, m-diallylbenzene, p-diallylbenzene, o-vinyltoluene, m-vinyltoluene, p-vinyltoluene, o-chlorostyrene, m-fluorostyrene, p-bromostyrene, o-chloromethylstyrene, p-bromomethylstyrene, p,t-butylstyrene, o-ethylstyrene, m-propylstyrene, 2-chloro-p-divinylbenzene, 2,5-dibromo-p-divinylbenzene, etc. or blends of these.

It is to be understood that the aforementioned list of components of the terpolymers of the present invention including the diepoxide of a polyether of a polyphenol, cyanate ester of the polyether of a polyphenol, and alkenyl aryl compounds are only representative of the type of compounds which may be employed, and that the present invention is not necessarily limited thereto.

It is also contemplated within the scope of the invention that the terpolymer may also have a polyalkadiene, in which the alkadiene monomers may contain from 2 to about 6 carbon atoms, incorporated therein. The addition of the polyalkadiene, which may be present in the terpolymer in amounts in the range of from about 0.5% to about 5% by weight of the terpolymer, will act to impart an improved peel strength to the metal foil portion of the laminate which is prepared from the use of the terpolymer. Some representative examples of these polyalkadienes which may be employed as additives to the terpolymers will include 1,2-polybutadiene, 1,3-polybutadiene, 1,2-polypentadiene, 1,3-polypentadiene, 1,2-polyhexadiene, 1,3-polyhexadiene, etc.

The novel homogeneous thermoset terpolymers of the present invention may be prepared in any suitable manner of operation which is known in the art. For example, one method of preparing the terpolymer is to blend the diepoxide of a polyether of a polyphenol with an alkenyl aryl compound and also to blend a free radical initiator such as benzoyl peroxide with the alkenyl aryl compound. In addition, a blend of a cyanate ester of a polyether of a polyphenol with the alkenyl aryl compound is formed, following which the three solutions are then blended to form a homogeneous pourable solution at ambient temperature. This resulting solution is then heated, the blending being effected at a temperature in the range of from about 50° C. to about 150° C. If so desired, other free radical initiators may be utilized to initiate the polymer reaction; for example, such other peroxides which may be used will include methyl ethyl ketone peroxide, t-butyl-peroctoate, t-amylperoctoate, dicumylperoxide, 1,1-bis(t-butylperoxy)-3,3,5-trimethylcyclohexane, etc. In addition, phenolic antioxidants such as 2,6-di-tert-butyl-4-methylphenol or ultraviolet light stabilizers such as 2-hydroxy 10-benzophenone may be added to the varnish. The homogeneous solution which is fluid at ambient temperature may then be poured onto a cloth reinforcement or injected into a mold containing a cloth reinforcement by various processes including composite reaction injection molding, reinforced reaction injection molding, or resin transfer molding, and cured at an elevated temperature in the range of from about 80° C. to about the boiling point of the alkenyl aryl compound for a period of time which may range from about 0.002 to about 1 hour. The cloth reinforcement may have coated or uncoated treated copper foil on both sides with a hole in one foil for solution to flow to reinforcement. Thereafter, the treated reinforcement may then be transferred to a separate cooling press, following which it may be postcured at a temperature ranging from about 150° C. to about 220° C. for a period of time which may range from about 1 to about 12 hours in duration. The processes may also involve having copper-plated caul plates inserted into the mold cavity; said copper plating having been treated with another metal and/or may be coated with a varnish which may be partially or fully cured after the coating. Alternatively, the caul plates may also be coated with partially or fully cured varnish containing metallic particles such as palladium-tin or an intermediate carrier may be coated with the filled varnish which would then be placed on the caul plate prior to varnish injection. This filled coating may, if so desired, take place of the plated copper. At least one of the caul plates which are used may contain at least one hole near the center thereof to permit the solution to flow to the reinforcement. If so desired, the caul plates may have three dimensional configurations which will produce non-planer or irregularly shaped thermoset laminates. Also, the caul plates may have a resist applied and developed so that a circuit pattern which is formed on the caul plate may be transferred to the part during the reaction molding. Likewise, a thermoset laminate with flush circuitry may be prepared if the resist is stripped off before reaction molding is effected.

It is also contemplated within the scope of this invention that the homogeneous solution may also be blended with particulate fillers and may then be poured into a mold or utilized in various other ways such as encapsulating a chip or forming a chip carrier or coating metal foils.

It is also contemplated within the scope of this invention that the homogeneous thermoset terpolymers may be prepared in a continuous manner of operation. When this type of operating is employed, the predetermined amounts of the diepoxide of a polyether of a polyphenol which has been dissolved in the alkenyl aryl compound and the alkenyl aryl compound in which the cyanate ester has been added along with the free radical initiator such as benzoyl peroxide, are continuously charged either separately or in a premixed state to a zone which is maintained at the proper operating conditions of temperature and pressure. An advantageous property of the varnishes or terpolymers of the present invention is that the terpolymers may be utilized to saturate a reinforcement such as glass cloth, etc. at ambient temperature without the necessity for adding a solvent which must be removed in a subsequent operation. Those skilled in the art will recognize that a continuous reactant charge is necessary, with amounts depending upon the individual components, to provide a high yield of product which contains the desired percentage of each component in the finished homogeneous thermoset terpolymers. After passage through this zone, the mixture resulting therefrom may be continuously withdrawn and utilized to coat and/or impregnate a substrate or reinforcement. The coated or impregnated substrate or reinforcement may thereafter be continuously charged to a curing zone where it is subjected to a partial cure by passage through this zone which is maintained at varying operating temperatures for a predetermined period of time. After passage through the zone, the resulting prepreg material is continuously withdrawn and passed to storage. The prepreg can then be layed up as sheets with or without a metal such as copper foil as an electrical or thermal conductor, and pressed in a predetermined number of sheets to form the desired laminate or circuit board matrix.

A solventless continuous lamination process may also be utilized to process clad or unclad laminates using the thermoset terpolymer in which one or more polymer saturated reinforcing cloths, which may not be B-staged, may be cured in a continuous belt-press between metal foil layers; between release film; belts coated with release or belts which are made of a release material.

Regardless of the method which is utilized to form the desired homogeneous thermoset terpolymer, it is contemplated that the three components of the final composition of matter may be present in various weight ratios so as to provide the necessary characteristics which are required to meet specific circuit board requirements. In the preferred embodiment of the invention, the diepoxide of a polyether of a polyphenol will be present in the finished composite in an amount in the range of from about 30% to about 50% by weight of the finished composite, the alkenyl aryl compound will be present in an amount in the range of from about 30% to about 50% by weight of the composite and the cyanate ester of a polyether of a polyphenol will be present in an amount in the range of from about 15% to about 20% by weight of the composite. For example, the brittleness of the polymer may be controlled by varying the amount of the cyanate ester of a polyether of a polyphenol or diepoxide of a polyether of a polyphenol. Likewise, by varying the weight percentage of other components, it is also possible to alter and control the viscosity. This is of importance in obtaining a polymer with 100% solids inasmuch as the presence of a volatile solvent may lead to emission control problems or entrapped volatile problems during the processing of the laminate.

While the above weight ratios constitute a preferred embodiment, it is also contemplated within the scope of this invention that the three components of the homogeneous thermoset terpolymers may be present in the finished composite in either a greater or lesser amount, depending upon the particular properties which are desired to be possessed by the finished composite, and that the present invention is not limited to these ratios.

In addition to the aforementioned favorable characteristics which are possessed by the homogeneous thermoset terpolymers of the present invention, another advantage in utilizing these terpolymers as components of a laminate is when employing a halogenated derivative of a diepoxide of a polyether of a polyphenol or a cyanate ester of a polyether of a polyphenol as a component of the terpolymer. The presence of these halogenated derivatives, and especially the brominated or chlorinated derivative, will introduce a desired property enhancement to a substrate or reinforcement in that the laminate may then meet certain flammability requirements such as UL 94 flammability tests.

The following examples are given for purposes of illustrating the novel homogeneous thermoset terpolymers of the present invention which possess the aforementioned desirable properties and to a method for the preparation thereof. However, it is to be understood that these examples are given merely for purposes of illustration and that the present invention is not necessarily limited thereto.

EXAMPLE I

To form the homogeneous thermoset terpolymer of the present invention, 36 grams of diepoxy tetrabromo-substituted p,p'-isopropylidenediphenol polymer and 12 grams of a vinyltoluene/divinylbenzene (70/30 by weight blend) were admixed at a temperature of 127° C. until the diepoxy was dissolved. A second solution comprising 28 grams of polymeric dicyanate ester of p,p'-isopropylidenediphenol and 12 grams of a vinyltoluene/divinylbenzene (70/30 by weight blend) were admixed at a temperature of 95° C. until the polymeric dicyanate ester compound had dissolved. A third solution comprising 1 gram of 1,2-polybutadiene and 8 grams of a vinyltoluene/divinylbenzene (70/30 weight blend) were admixed at a temperature of 95° C. until the 1,2-polybutadiene dissolved. To the latter solution was added 3.6 grams of benzoyl peroxide which was dissolved by admixture at 95° C. The three solutions were then admixed while maintaining a temperature of 95° C. Once blended, the terpolymer was allowed to cool to ambient temperature.

The homogeneous solution, which was fluid at ambient temperature, was then utilized to form a prepreg which was used to form a laminate. To form the prepreg, the varnish was used to saturate vinylsilane treated 116 E-glass cloth. The saturated E-glass cloth was B-staged at 121° C. for 2 minutes. The resulting prepreg had 47.5% resin content, and it had 21.9% flow when pressing 4 plies 2×"2" at 210 psi and 150° C. This tack-free prepreg was used to form a laminate. To form the desired laminate, a copper foil (1 ounce/square foot) was placed on a 7×7×0.070" caul plate. Following this, 12 plies of the prepreg described above were stacked on the copper foil. A second piece of copper foil was placed on top of the stack and a caul plate was placed on top of this foil. Following this, two plies of Kraft paper were placed on each side of the caul plates and the sample was pressed for a period of one hour at 150° C. and for a period of 1 hour at 177° C. at 45 psi. The laminate was then cooled under pressure until it reached ambient temperature and was then recovered. The laminate was then postbaked 16 hours at 177° C. Analysis of the laminate showed a glass transition temperature ($T_g$) of 239° C., a dielectric constant of 3.56 and a dissipation factor of 0.012 for a sample containing a resin content of 35.98% tested at 1 MHz. Further analysis of the laminate showed a copper foil peel strength of 7.6 lbs per inch.

EXAMPLE II

Another terpolymer was prepared by admixing 18 grams of the dicyanate ester of p,p'-isopropylidenediphenol and 10 grams of divinylbenzene at a temperature of 95° C. A second solution was also prepared by dissolving 19 grams of diepoxy tetrabromo-substituted p,p'-isopropylidenediphenol polymer in 10 grams of divinylbenzene at a temperature of 95° C. A third solution was prepared by dissolving 1.0 grams of benzoyl peroxide in 5 grams of divinylbenzene at a temperature of 65° C. and admixing the three solutions, following which 0.02 grams zinc octoate was added to this blend. The resulting terpolymer had a viscosity of about 10 cp at ambient temperature.

To prepare the desired laminate, a coated copper foil was placed on a caul plate, coating side up, and a ply of vinylsilane-treated E-glass cloth was placed on top of the foil. The ply was then saturated with the terpolymer and the procedure was continued until 12 plies of the saturated cloth were formed. A second piece of copper foil was placed on top of the plies, a caul plate was placed on top of the stack and 4 plies of Kraft paper were placed on each side of the caul plates. The stack was placed in a press which had been preheated to a temperature of 130° C. and pressed at a pressure of 15 psi for a period of 1 hour. At the end of this time the temperature was increased to 177° C. and maintained thereat for an additional period of 1 hour. At the end of this time the stack was cooled and the laminate was recovered. The laminate had a peel strength of 3.6 lbs. per inch, a dielectric constant of 4.17 and 39.0% retained resin laminate at 1 MHz, a dissipation factor of 0.013 and a glass transition temperature ($T_g$) of 252° C.

EXAMPLE III

To illustrate the use of varying amounts of components, a solution was prepared by blending 14 grams of the dicyanate ester of p,p'-isopropylidenediphenol and 6 grams of vinyltoluene which was then heated to a temperature of 95° C. for a period of 20 minutes to dissolve the dicyanate ester. A second solution was prepared by blending 18 grams of diepoxy tetrabromo-substituted p,p'-isopropylidenediphenol polymer and 4 grams of vinyltoluene and heating the blend to a temperature of 125° C. for a period of 30 minutes. A third solution was prepared by blending 1 gram of 1,2-polybutadiene and 4 grams of vinyltoluene at a temperature of 95° C. for a period of 10 minutes. The three solutions were then admixed at a temperature of 95° C. and after admixture, the blend was allowed to cool. After cooling, 1.2 grams of the liquid peroxide 1,1-bis(t-butylperoxy) 3,3,5-trimethylcyclohexane was added as a free radical initiator.

The resulting homogeneous thermoset terpolymer was then utilized to saturate 9 plies of vinylsilane-treated E-glass cloth. The laminate was prepared by placing a 1 oz. per square foot copper foil on a caul plate and placing the plies of the cloth on top of the copper foil. As each glass cloth layer was placed on the stack, the terpolymer was poured onto the cloth to saturate it, and spread to ensure complete saturation. The stack was topped with a treated copper foil, treatment side down, and topped with a second caul plate. Thereafter, 4 plies of Kraft paper were placed outside the caul plates and the stack was cured in a press at a pressure of 15 psi for a period of 1 hour at 140° C. and 1 hour at 177° C. After cooling the press, the laminate was removed and postbaked for a period of 16 hours at a temperature of 185° C. The resulting post-baked laminate had a peel strength of 6.0 lbs/inch. Further analysis of the laminate disclosed a dielectric constant of 3.27 at 1 MHz for a laminate with 36.28% retained resin, a dissipation factor of 0.0057. Thermal analysis of the laminate showed a major $T_g$ of 240° C. and a minor transition at 104° C.

EXAMPLE IV

In a similar manner, other terpolymers may be prepared by forming a solution of diepoxy tetrabromo-substituted p,p'-isopropylidenediphenol (bisphenol A) and styrene and thereafter blending this solution with a second solution of the dicyanate ester of bisphenol A and styrene at an elevated temperature. The resulting terpolymer, after recovery, may be used to saturate or impregnate a substrate such as Kevlar which may then be topped with copper foil and pressed to form a desired laminate, the number of plies of saturated substrate being dependent upon the particular usage for which the laminate is to be employed.

Other homogeneous thermoset terpolymers may also be prepared by forming a solution of diepoxy bisphenol A and divinylbenzene, admixing this blend with a blend of the dicyanate ester of bisphenol A and divinylbenzene, followed by the addition of a blend of 1,2-polybutadiene and divinylbenzene, the blending of each solution being performed at an elevated temperature of about 65° C. If so desired, a free radical initiator such as benzoyl peroxide may also be added, following which the terpolymer may then be used to impregnate a substrate in a manner similar to that hereinbefore set forth. The impregnated substrate may then be utilized in a predetermined number of plies to form a laminate containing a conductive metal such as copper on one or both sides of the laminate.

I claim as my invention:

1. Homogeneous thermoset terpolymers consisting essentially of:
   (1) from about 30% to about 50% by weight of said terpolymer of a diepoxide of a polyether of a polyphenol having the structure:

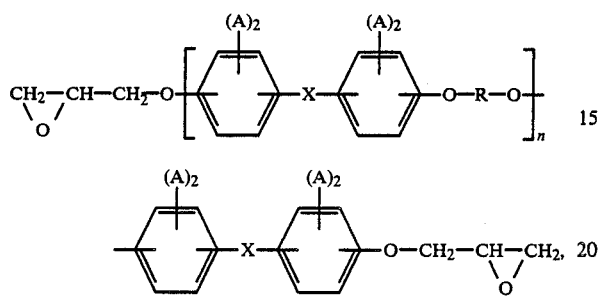

in which X is selected from the group consisting of

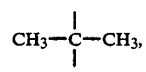

SO$_2$, O, and CH$_2$ radicals, R is selected from the group consisting of —CH$_2$—C$_6$H$_4$—CH$_2$—, (CH$_2$)$_b$ in which b ranges from 1 to about 6, —CH$_2$—CH=CH—CH$_2$—, —CH$_2$—C≡C—CH$_2$—, —CH$_2$—C$_6$H$_2$A$_2$—CH(OY)—CH$_2$—CH(CH$_2$OY)—C$_6$H$_2$A$_2$—CH$_2$—, —N=CH—O—C$_6$H$_4$—C(CH$_3$)$_2$—C$_6$H$_4$—O—CH=N—, —CH(NH)—O—C$_6$H$_4$—C(CH$_3$)$_2$—C$_6$H$_4$—O—CH(NH)—, —C$_6$H$_4$—CH(OY)—CH$_2$CH(M)—CH$_2$CH(CH$_2$OY)—C$_6$H$_4$—, —CH$_2$—CH(OH)—CH$_2$—O—C$_6$H$_4$C(CH$_3$)$_2$—C$_6$H$_4$—O—CH$_2$—CH(OH)—CH$_2$—, and —CH$_2$—CH(OH)—CH$_2$—O—C$_6$H$_2$Br$_2$—C(CH$_3$)$_2$—C$_6$H$_2$Br$_2$—O—CH$_2$—CH(OH)—CH$_2$— radicals, where M is —C$_6$H$_5$, —C$_6$H$_4$(CH$_3$) or —C$_6$H$_4$(CH=CH$_2$) and Y is a free radical such as hydroquinone, A is independently selected from the group consisting of hydrogen, chlorine, bromine, fluorine, alkyl, alkoxy and phenyl radicals and n has a average value in range of from about 0 to about 20;

(2) from about 15% to about 20% by weight of said terpolymer of a dicyanate ester of a polyether of a polyphenol having the structure:

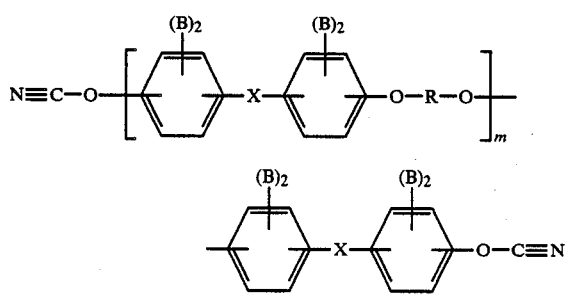

in which X is selected from the group consisting of

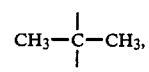

SO$_2$, O, S, and CH$_2$ radicals, R is selected from the group consisting of —CH$_2$—C$_6$H$_4$—CH$_2$—, (CH$_2$)$_b$ in which b ranges from 1 to about 6, —CH$_2$—CH=CH—CH$_2$—, —CH$_2$—C≡C—CH$_2$,

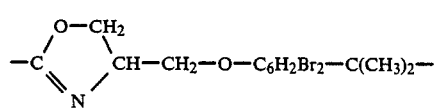

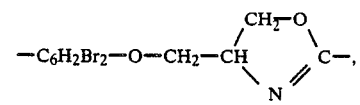

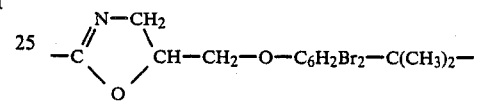

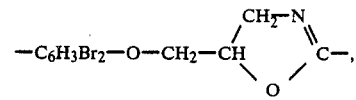

and;

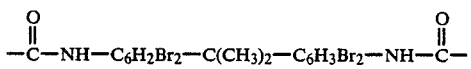

radicals, B is independently selected from the group consisting of hydrogen, chlorine, bromine, fluorine, alkyl, alkoxy and phenyl radicals and m has an average value in the range of from about 0 to about 20;

(3) from about 30% to about 50% by weight of said terpolymer of an alkenyl aryl compound; and
   (4) about 0.5% to about 5% by weight of a polyalkadiene.

2. The homogeneous thermoset terpolymer as set forth in claim 1 in which A is hydrogen.

3. The homogeneous thermoset terpolymer as set forth in claim 1 in which A is bromine.

4. The homogeneous thermoset terpolymer as set forth in claim 1 in which A is methyl.

5. The homogeneous thermoset terpolymer as set forth in claim 1 in which B is hydrogen.

6. The homogeneous thermoset terpolymer as set forth in claim 1 in which B is bromine.

7. The homogeneous thermoset terpolymer as set forth in claim 1 in which B is methyl.

8. The homogeneous thermoset terpolymer as set forth in claim 1 in which said alkenyl aryl compound is divinylbenzene.

9. The homogeneous thermoset terpolymer as set forth in claim 1 in which said alkenyl aryl compound is styrene.

10. The homogeneous thermoset terpolymer as set forth in claim 1 in which said alkenyl aryl compound is vinyltoluene.

11. The homogeneous thermoset terpolymer as set forth in claim 1 in which said polyalkadiene is 1,2-polybutadiene.

12. The homogeneous thermoset terpolymer as set forth in claim 1 in which said diepoxide of a polyether of a polyphenol is diepoxy p,p'-isopropylidenediphenol, said dicyanate ester of a polyether of a polyphenol is the dicyanate ester of p,p'-isopropylidenediphenol and said alkenyl aryl compound is divinylbenzene.

13. The homogeneous thermoset terpolymer as set forth in claim 1 in which said diepoxide of a polyether of a polyphenol is diepoxy tetrabromo-substituted p,p'-isopropylidenediphenol, the dicyanate ester of a polyether of a polyphenol is the dicyanate ester of p,p'-isopropylidenediphenol and said alkenyl aryl compound is divinylbenzene.

14. The homogeneous thermoset terpolymer as set forth in claim 1 in which said diepoxide of a polyether of a polyphenol is diepoxy tetrabromo-substituted p,p'-isopropylidenediphenol, the dicyanate ester of a polyether of a polyphenol is the dicyanate ester of tetrabromo-substituted p,p'-isopropylidenediphenol and said alkenyl aryl compound is divinylbenzene.

15. The homogeneous thermoset terpolymer as set forth in claim 1 in which said diepoxide of a polyether of a polyphenol is diepoxy p,p'-isopropylidenediphenol, said dicyanate ester of a polyether of a polyphenol is the dicyanate ester of p,p'-isopropylidenediphenol and said alkenyl aryl compound is vinyltoluene.

16. The homogeneous thermoset terpolymer as set forth in claim 1 in which said diepoxide of a polyether of a polyphenol is diepoxy tetrabromo-substituted p,p'-isopropylidenediphenol, the dicyanate ester of a polyether of a polyphenol is the dicyanate ester of p,p'-isopropylidenediphenol and said alkenyl aryl compound is vinyltoluene.

17. A process for the production of a homogeneous thermoset terpolymer which consists of reacting a blend consisting of:

(1) a diepoxide of a polyether of a polyphenol having the structure:

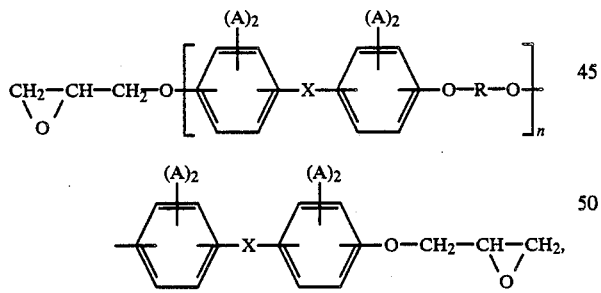

in which X is selected from the group consisting of

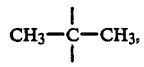

$SO_2$, O, and $CH_2$ radicals, R is selected from the group consisting of $-CH_2-C_6H_4-CH_2-$, $(CH_2)_b$ in which b ranges from 1 to about 6, $-CH_2-CH=CH-CH_2-$, $-CH_2-C\equiv C-CH_2-$, $-CH_2-C_6H_2A_2-CH(OY)-CH_2-CH(CH_2OY)-C_6H_2A_2-CH_2-$, $-N=CH-O-C_6H_4-C(CH_3)_2-C_6H_4-O-CH=N-$, $-CH(NH)-O-C_6H_4-C(CH_3)_2-C_6H_4-O-CH(NH)-$, $-C_6H_4-CH(OY)-CH_2-CH(M)-CH_2-CH(CH_2OY)-C_6H_4-$, $-CH_2-CH(OH)-CH_2-O-C_6H_4-C(CH_3)_2-C_6H_4-O-CH_2-CH(OH)-CH_2-$, and $-CH_2-CH(OH)-CH_2-O-C_6H_2Br_2-C(CH_3)_2-C_6Br_2-O-CH_2CH(OH)-CH_2-$ radicals, where M is $-C_6H_5$, $-C_6H_4(CH_3)$ or $-C_6H_4(CH=CH_2)$ and Y is a free radical such as hydroquinone, A is independently selected from the group consisting of hydrogen, chlorine, bromine, fluorine, alkyl, alkoxy and phenyl radicals and n has an average value in the range of from about 0 to about 20, and an alkenyl aryl compound with a blend consisting of:

(2) a dicyanate ester of a polyether of a polyphenol having the structure:

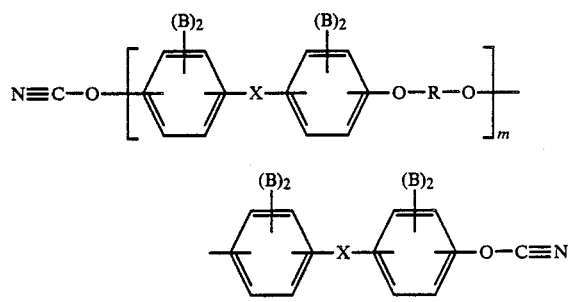

in which X is selected from the group consisting of

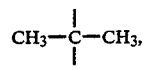

$SO_2$, O, S, and $CH_2$ radicals, R is selected from the group consisting of $-CH_2-C_6H_4-CH_2-$, $(CH_2)_b$ in which b ranges from 1 to about 6, $-CH_2-CH=CH-CH_2-$, $-CH_2C\equiv C-CH_2-$,

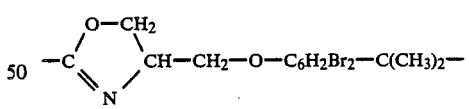

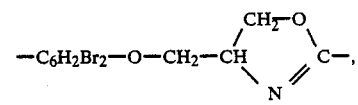

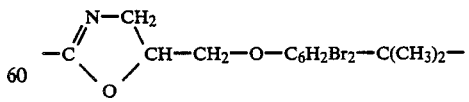

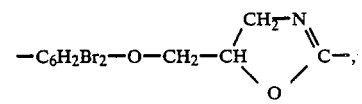

and;

-continued

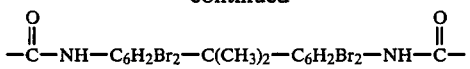

radicals, B is independently selected from the group consisting of hydrogen, chlorine, bromine, fluorine, alkyl, alkoxy and phenyl radicals and m has an average value in the range of from about 0 to about 20;

(3) an alkenyl aryl compound at reaction conditions. and (4) about 0.5% to about 5% by weight of a polyalkadiene and recovering the resultant homogeneous thermoset terpolymer.

18. The process as set forth in claim 17 in which said reaction conditions include a temperature in the range of from about 50° C. to about 150° C. and a pressure in the range of from about atmospheric to about 50 atmospheres.

19. The process as set forth in claim 17 further characterized in that said reaction is effected in the presence of a free radical initiator.

20. The process as set forth in claim 19 in which said free radical initiator is 1,1-bis(t-butylperoxy)-3,3,5-trimethylcyclohexane.

21. The process as set forth in claim 19 in which said free radical initiator is benzoyl peroxide.

22. The process as set forth in claim 17 in which said diepoxide of a polyether of a polyphenol is diepoxy p,p′-isopropylidenediphenol, said dicyanate ester of a polyether of a polyphenol is the dicyanate ester of p,p′-isopropylidenediphenol and said alkenyl aryl compound is divinylbenzene.

23. The process as set forth in claim 17 in which said diepoxide of a polyether of a polyphenol is diepoxy tetrabromo-substituted p,p′-isopropylidenediphenol, the dicyanate ester of a polyether of a polyphenol is the dicyanate ester of p,p′-isopropylidenediphenol and said alkenyl aryl compound is divinylbenzene.

24. The process as set forth in claim 15 in which said diepoxide of a polyether of a polyphenol is diepoxy tetrabromo-substituted p,p′-isopropylidenediphenol, the dicyanate ester of a polyether of a polyphenol is the dicyanate ester of tetrabromo-substituted p,p′-isopropylidenediphenol and said alkenyl aryl compound is divinylbenzene.

25. The process as set forth in claim 17 in which said diepoxide of a polyether of a polyphenol is diepoxy p,p′-isopropylidenediphenol, said dicyanate ester of a polyether of a polyphenol is the dicyanate ester of p,p′-isopropylidenediphenol and said alkenyl aryl compound is vinyltoluene.

26. The process as set forth in claim 20 in which said diepoxide of a polyether of a polyphenol is diepoxy tetrabromo-substituted p,p′-isopropylidenediphenol, the dicyanate ester of a polyether of a polyphenol is the dicyanate ester of p,p′-isopropylidenediphenol and said alkenyl aryl compound is vinyltoluene.

27. The process as set forth in claim 17 wherein said polyalkadiene is 1,2 polybutadiene.

28. The process as set forth in claim 17 wherein A is hydrogen.

29. The process as set forth in claim 17 wherein A is bromine.

30. The process as set forth in claim 17 wherein A is methyl.

31. The process as set forth in claim 17 wherein B is hydrogen.

32. The process as set forth in claim 17 wherein B is bromine.

33. The process as set forth in claim 17 wherein B is methyl.

34. The process as set forth in claim 17 wherein said alkenyl aryl compound is divinylbenzene.

35. The process as set forth in claim 17 wherein said alkenyl aryl compound is styrene.

36. The process as set forth in claim 17 wherein said alkenyl aryl compound is vinyl toluene.

* * * * *

UNITED STATES PATENT AND TRADEMARK OFFICE
CERTIFICATE OF CORRECTION

PATENT NO.   :   4,782,116
DATED        :   November 1, 1988
INVENTOR(S)  :   M. Holte It is certified that error appears in the above-identified patent and that said Letters Patent are hereby corrected as shown below:

IN THE CLAIMS

Column 13, line 39,
   insert " - " after $CH_2$

Column 13, line 40,
   insert " - " after $CH_2$ (first occurrence))

Column 16, line 7, delete "-$C_6Br_2$-O-$CH_2$CH(OH)" to read -- -$C_6H_2Br_2$-O-$CH_2$-CH(OH) --.

Column 16, line 45,
   insert " - " after $CH_2$ (second occurrence).

Column 17, line 11,
   delete the "conditions."; substitute therefor -- conditions; --.

Column 18, line 1,
   delete "15"; substitute therefor -- 17 --.

Signed and Sealed this

Thirtieth Day of May, 1989

Attest:

DONALD J. QUIGG

Attesting Officer       Commissioner of Patents and Trademarks